(12) United States Patent
Lei et al.

(10) Patent No.: US 11,444,168 B2
(45) Date of Patent: Sep. 13, 2022

(54) TRANSISTOR DEVICES AND METHODS OF FORMING TRANSISTOR DEVICES

(71) Applicant: GLOBALFOUNDRIES Singapore Pte. Ltd., Singapore (SG)

(72) Inventors: Jiacheng Lei, Singapore (SG); James Jerry Joseph, Singapore (SG); Khee Yong Lim, Singapore (SG); Lulu Peng, Singapore (SG); Lawrence Selvaraj Susai, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/086,501

(22) Filed: Nov. 2, 2020

(65) Prior Publication Data

US 2022/0140096 A1    May 5, 2022

(51) Int. Cl.
| | |
|---|---|
| *H01L 29/423* | (2006.01) |
| *H01L 29/40* | (2006.01) |
| *H01L 29/66* | (2006.01) |
| *H01L 29/778* | (2006.01) |
| *H01L 29/10* | (2006.01) |

(52) U.S. Cl.
CPC ........ *H01L 29/42368* (2013.01); *H01L 29/10* (2013.01); *H01L 29/401* (2013.01); *H01L 29/4236* (2013.01); *H01L 29/66522* (2013.01); *H01L 29/7786* (2013.01)

(58) Field of Classification Search
CPC . H01L 29/42368; H01L 29/10; H01L 29/401; H01L 29/4236; H01L 29/66522; H01L 29/7786
See application file for complete search history.

(56) References Cited

U.S. PATENT DOCUMENTS

2020/0219987 A1*  7/2020  Lee ................. H01L 29/2003

OTHER PUBLICATIONS

Sithanandam et al., "A new Hetero-material Stepped Gate (HSG) SOI LDMOS for RF Power Amplifier Applications", 2010 23rd International Conference on VLSI Design, 2010, pp. 230-234, IEEE.
Kabemura et al., "Enhancement of Breakdown Voltage in AlGaN/GaN HEMTs: Field Plate Plus High-κ Passivation Layer and High Acceptor Density in Buffer Layer", IEEE Transactions on Electron Devices, 2018, pp. 3848-3854, vol. 65, No. 9, IEEE.
Ikeda et al., "High-power AlGaN/GaN MIS-HFETs with field-plates on Si substrates", 2009 21st International Symposium on Power Semiconductor Devices & IC's, 2009, pp. 251-254, IEEE.

(Continued)

*Primary Examiner* — Syed I Gheyas
(74) *Attorney, Agent, or Firm* — Viering Jentschura & Partner mbB (57) ABSTRACT

A transistor device may be provided, including a substrate; a buffer layer arranged over the substrate; a source terminal, a drain terminal, and a gate terminal arranged over the buffer layer; a barrier layer arranged over the buffer layer; and a passivation layer arranged over the barrier layer. The gate terminal may be arranged laterally between the source terminal and the drain terminal, the barrier layer may include a recess laterally between the gate terminal and the drain terminal, a part of the gate terminal may be arranged over the passivation layer and the passivation layer may extend into the recess of the barrier layer.

20 Claims, 11 Drawing Sheets

(56) References Cited

OTHER PUBLICATIONS

Lu et al., "Normally OFF Al2O3—AlGaN/GaN MIS-HEMT With Transparent Gate Electrode for Gate Degradation Investigation", IEEE Transactions on Electron Devices, 2015, pp. 821-827, vol. 62, No. 3, IEEE.

Meneghini et al., "Power GaN HEMT degradation: from time-dependent breakdown to hot-electron effects", 2018 IEEE International Electron Devices Meeting (IEDM), 2018, 4 pages, IEEE.

* cited by examiner

TRANSISTOR DEVICES AND METHODS OF FORMING TRANSISTOR DEVICES

TECHNICAL FIELD

The present disclosure relates generally to transistor devices, and methods of forming the transistor devices.

BACKGROUND

Transistor devices, such as high electron mobility transistor (HEMT) devices are often used in high-frequency or high power applications, such as in high-frequency telecommunications and high voltage power switching applications. A typical HEMT device usually includes two materials with different bandgaps arranged adjacent to each other to form a hetero junction therebetween. Due to a difference in the conduction band energy of the materials, electrons may diffuse from the wide bandgap material to the narrow bandgap material to form a conducting channel commonly known as a two-dimensional electron gas (2DEG) channel.

Typically, the HEMT device also includes a source, a drain and a gate arranged between them. In operation, the HEMT device may be turned on by applying an appropriate gate voltage. For example, for power switching applications, the HEMT device may switch from a high voltage OFF-state to a high current ON-state. During this switching, the HEMT device usually goes through a semi-on state where its drain bias is high (for example, about 600V) and where current starts to flow through the 2DEG channel. In this state, a high electric field may be formed at a corner of the gate in the HEMT device and this may accelerate the electrons flowing through the 2DEG channel. These electrons (also known as "hot electrons") may be trapped in the materials forming the hetero-junction. This can cause hot carrier degradation, degradation of the reliability of the gate dielectric layer, degradation in the stability of the device's threshold voltage ($V_{th}$) and dynamic on-resistance ($R_{on}$) degradation.

Therefore, it is desirable to provide an improved transistor device with reduced gate corner electric field, and reduced generation and trapping of hot electrons.

SUMMARY

According to various non-limiting embodiments, there may be provided a transistor device including: a substrate; a buffer layer arranged over the substrate; a source terminal, a drain terminal, and a gate terminal arranged over the buffer layer; where the gate terminal may be arranged laterally between the source terminal and the drain terminal; a barrier layer arranged over the buffer layer; where the barrier layer may include a recess laterally between the gate terminal and the drain terminal; and a passivation layer arranged over the barrier layer, where a part of the gate terminal may be arranged over the passivation layer; and the passivation layer may extend into the recess of the barrier layer.

According to various non-limiting embodiments, there may be provided a method of forming a transistor device, the method including: providing a substrate; forming a buffer layer over the substrate; forming a source terminal, a drain terminal, and a barrier layer over the buffer layer, where the barrier layer may include a recess; forming a passivation layer over the barrier layer, where the passivation layer may extend into the recess of the barrier layer; and forming a gate terminal over the buffer layer, where the gate terminal may be arranged laterally between the source terminal and the drain terminal, where a part of the gate terminal may be arranged over the passivation layer, and where the recess of the barrier layer may be arranged laterally between the gate terminal and the drain terminal.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

The embodiments generally relate to transistor devices. More particularly, some embodiments relate to high electron mobility transistor (HEMT) devices. The HEMT devices may be used in several applications, such as, but not limited to, high-frequency telecommunications, high-frequency computing, and high power switching applications (such as, but not limited to, power converters). In some non-limiting embodiments, the HEMT devices may be used as 200V or 650V enhancement-mode HEMT devices.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1:
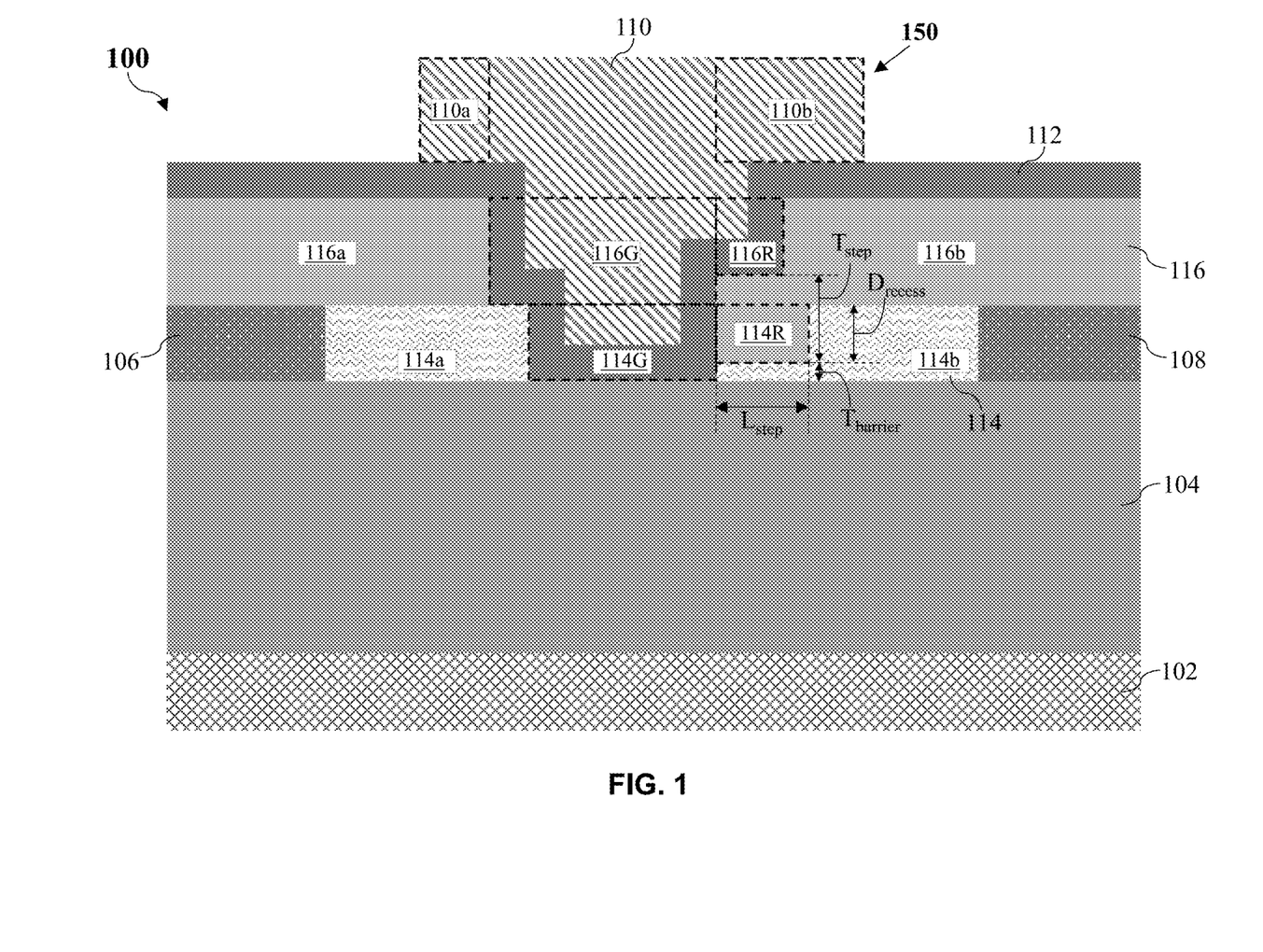
FIG. 1 shows a simplified cross-sectional view of a transistor device according to various non-limiting embodiments.

FIG. 1 shows a simplified cross-sectional view of a transistor device 100 according to various non-limiting embodiments. The transistor device 100 may be a high electron mobility transistor (HEMT) device. For example, the transistor device 100 may be a metal-insulator-semiconductor high electron mobility transistor (MIS-HEMT) device.

Referring to FIG. 1, the transistor device 100 may include a substrate 102. The substrate 102 may be a semiconductor substrate. For example, the substrate 102 may include semiconductor material, such as but not limited to, silicon (Si), sapphire, silicon carbide (SiC), poly-aluminum nitride (poly-AlN), or combinations thereof.

The transistor device 100 may further include a buffer layer 104 arranged over the substrate 102. The buffer layer 104 may be an epitaxy layer and may include buffer material, such as, but not limited to gallium nitride (GaN), aluminum gallium nitride (AlGaN), aluminum nitride (AlN), or combinations thereof. The buffer layer 104 may have a first bandgap ranging from about 3.4 eV (for example, when the buffer layer 104 includes GaN) to about 6.2 eV (for example, when the buffer layer 104 includes AlN). In a non-limiting embodiment, the buffer layer 104 may include GaN and the transistor device 100 may be a GaN MIS-HEMT device.

The transistor device 100 may further include a source terminal 106, a drain terminal 108 and a gate structure 150 arranged over the buffer layer 104. The gate structure may include a gate terminal 110 and a gate dielectric layer 112 arranged at least partially under the gate terminal 110. As shown in FIG. 1, the gate terminal 110 may be arranged laterally between the source terminal 106 and the drain terminal 108. Each of the source terminal 106 and the drain terminal 108 may include an ohmic contact. Each ohmic contact may include an electrically conductive material such as, but not limited to, titanium, titanium nitride, aluminum, or combinations thereof. The gate terminal 110 may also include an electrically conductive material such as, but not limited to, polysilicon, titanium nitride, tantalum nitride, tungsten, aluminum or combinations thereof. The gate dielectric layer 112 may include a dielectric material, for example, an oxide or nitride material such as, but not limited to, aluminum oxide ($Al_2O_3$), silicon nitride (SiN), or combinations thereof.

The transistor device 100 may also include a barrier layer 114 arranged over the buffer layer 104. The barrier layer 114 may be an epitaxial layer and may include barrier material such as, but not limited to, gallium nitride (GaN), aluminum gallium nitride (AlGaN), aluminum nitride (AlN), or combinations thereof. The barrier layer 114 may have a second bandgap. In various non-limiting embodiments, the second bandgap of the barrier layer 114 may range from about 3.4 eV (for example, when the barrier layer 114 includes GaN) to about 6.2 eV (for example, when the barrier layer 114 includes AlN). The second bandgap of the barrier layer 114 may be different from (for example, may be wider than) the first bandgap of the buffer layer 104. For example, the buffer layer 104 may include GaN (with a narrower bandgap) and the barrier layer 114 may include AlGaN (with a wider bandgap). In a non-limiting embodiment, a portion of the buffer layer 104 (for example, a portion with a thickness of about 200 nm to about 1500 nm) under and contacting the barrier layer 114 may include GaN to allow a 2DEG conduction channel to be formed therein.

Referring to FIG. 1, the barrier layer 114 may include a first barrier portion 114a, a second barrier portion 114b and a gap 114G arranged laterally between the first barrier portion 114a and the second barrier portion 114b. The gate terminal 110 may be a recessed gate. In other words, the gate terminal 110 (together with the gate dielectric layer 112 thereunder) may extend partially into the gap 114G of the barrier layer 114. In particular, the gate dielectric layer 112 may line the gap 114G of the barrier layer 114. Accordingly, the first barrier portion 114a of the barrier layer 114 may be arranged laterally between the source terminal 106 and the gate terminal 110, and the second barrier portion 114b of the barrier layer 114 may be arranged laterally between the drain terminal 108 and the gate terminal 110. As shown in FIG. 1, a thickness of the first barrier portion 114a may be substantially uniform; whereas, a recess 114R may be arranged within the second barrier portion 114b. In other words, the barrier layer 114 may include a recess 114R laterally between the gate terminal 110 and the drain terminal 108. The recess 114R may extend partially through a thickness of the barrier layer 114, such that a portion of the barrier layer 114 may be arranged under the recess 114R (in particular, vertically between the recess 114R and the buffer layer 104). In addition, the recess 114R may contact the gate dielectric layer 112 and may extend laterally from the gate dielectric layer 112 in a direction towards the drain terminal 108. A length $L_{step}$ of the recess 114R may range from about 50 nm to about 600 nm (e.g. from about 100 nm to about 300 nm in some non-limiting embodiments). A thickness $T_{barrier}$ of the barrier layer 114 under the recess 114R may range from about 3 nm to about 30 nm. A depth $D_{recess}$ of the recess 114R may range from about 5 nm to about 27 nm.

The transistor device 100 may also include a passivation layer 116 arranged over the barrier layer 114, the source terminal 106 and the drain terminal 108. The passivation layer 116 may be a dielectric layer including dielectric material, such as an oxide material or a nitride material. For example, the passivation layer 116 may include aluminum oxide ($Al_2O_3$), aluminum oxide nitride (AlON), silicon oxide ($SiO_2$), silicon nitride ($SiN_x$), or combinations thereof.

Referring to FIG. 1, the passivation layer 116 may include a first passivation segment 116a, a second passivation segment 116b and a gap 116G arranged laterally between the first passivation segment 116a and the second passivation segment 116b. The first passivation segment 116a may be arranged over the source terminal 106 and the first barrier portion 114a; whereas, the second passivation segment 116b may be arranged over the drain terminal 108 and the second barrier portion 114b. As shown in FIG. 1, the passivation layer 116 (in particular, the second passivation segment 116b) may extend into the recess 114R of the barrier layer 114. Accordingly, a "step" may be formed within the passivation layer 116 and in some non-limiting embodiments, the passivation layer 116 may thus be referred to as a "stepped dielectric layer". A thickness $T_{step}$ of the passivation layer 116 between the gate dielectric layer 112 over the recess 114R and a bottom surface of the recess 114R may range from about 10 nm to about 500 nm.

The second passivation segment 116b may include a recess 116R over the recess 114R of the barrier layer 114, where the recess 116R may overlap vertically with the recess 114R. As shown in FIG. 1, the gate terminal 110 and the gate dielectric layer 112 may extend into both the gap 116G and the recess 116R of the passivation layer 116. In particular, the gate dielectric layer 112 may line a part of the recess 116R and a part of the gap 116G. As shown in FIG. 1, sides of the gaps 114G, 116G facing in a direction towards the drain terminal 108 may be vertically aligned; whereas, sides of the gaps 114G, 116G facing in a direction towards the source terminal 106 may be laterally offset from each other. In particular, the first barrier portion 114a may protrude laterally beyond the first passivation segment 116a in a direction towards the gate terminal 110. However, depending on the fabrication process, the gaps 114G, 116G may instead be vertically aligned along both sides.

As shown in FIG. 1, the gate terminal 110 may be at least partially arranged over the passivation layer 116, with the gate dielectric layer 112 arranged between the gate terminal 110 and the passivation layer 116. The gate terminal 110 may include a first part 110a and a second part 110b arranged over the passivation layer 116, where the first part 110a may overlap vertically with the first barrier portion 114a of the barrier layer 114, and the second part 110b may overlap vertically with the second barrier portion 114b of the barrier layer 114. In particular, the second part 110b of the gate terminal 110 may be arranged over (or in other words, may overlap vertically with) the recess 114R of the barrier layer 114.

FIGS. 2A to 2D show simplified cross-sectional views illustrating a method of forming the transistor device 100 according to various non-limiting embodiments. For clarity of illustration, some reference numerals have been omitted from FIGS. 2A to 2D.

Figure 2A:
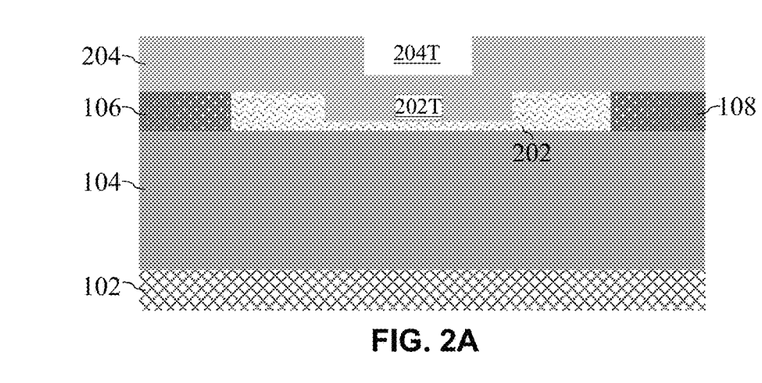
FIGS. 2A to 2D show simplified cross-sectional views illustrating a method of forming the transistor device of FIG. 1 according to various non-limiting embodiments.

Referring to FIG. 2A, the method may include providing the substrate 102 and forming the buffer layer 104 over the substrate 102. The method may further include forming the source terminal 106 and the drain terminal 108 over the buffer layer 104.

Figure 2B:
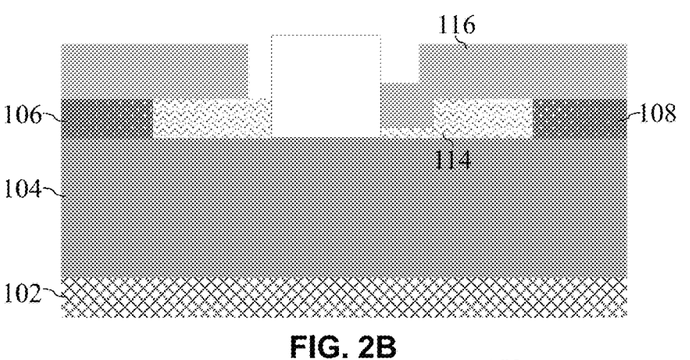

Referring to FIGS. 2A to 2B, the method may further include forming the barrier layer 114 over the buffer layer 104 and the passivation layer 116 over the barrier layer 114.

As shown in FIG. 2A, the method may include forming a layer of barrier material 202 over the buffer layer 104 and forming a first trench 202T within the layer of barrier material 202. The first trench 202T may extend partially through a thickness of the layer of barrier material 202. The first trench 202T may be formed using any method as known to those skilled in the art. For example, the first trench 202T may be formed by etching the barrier material 202. The method may further include forming a layer of passivation material 204 over the layer of barrier material 202 and further over the source and drain terminals 106, 108. Due to the presence of the first trench 202T, the layer of passivation material 204 may include a second trench 204T, where the second trench 204T may be narrower than the first trench 202T.

As shown in FIG. 2B, the method may further include forming the barrier layer 114 and the passivation layer 116 from the layer of barrier material 202 and the layer of passivation material 204, respectively. In particular, the method may include removing a part of the layer of barrier material 202 and a part of the layer of passivation material 204 to form the barrier layer 114 and the passivation layer 116, respectively. In particular, the parts of the barrier material 202 and the passivation material 204 may be removed by etching or any other method as known to those skilled in the art.

Figure 2C:
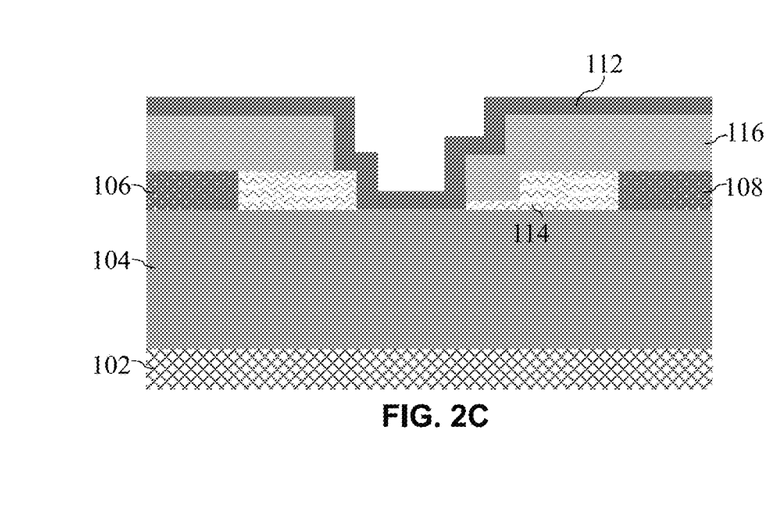

Referring to FIG. 2C, the method may further include forming the gate dielectric layer 112 over the passivation layer 116. The gate dielectric layer 112 may be formed by depositing a dielectric material over the passivation layer 116 to line the surfaces of the passivation layer 116, the barrier layer 114 and the buffer layer 104.

Figure 2D:
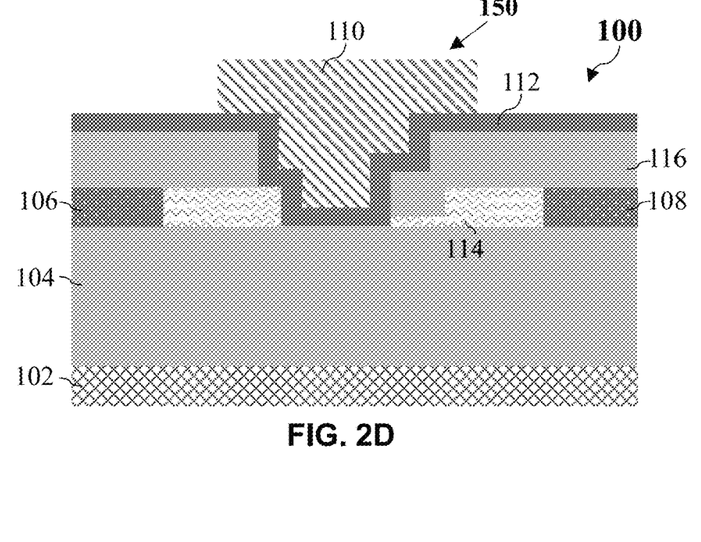

Referring to FIG. 2D, the method may further include forming the gate terminal 110 over the buffer layer 104. The gate terminal 110 may be formed using any method known to those skilled in the art. For example, the gate terminal 110 may be formed by depositing an electrically conductive material over the gate dielectric layer 112, such that the electrically conductive material may fill the gap 114G of the barrier layer 114, and the gap 116G and recess 116R of the passivation layer 116. The electrically conductive material may then be etched to form the gate terminal 110.

The above described order for the method is only intended to be illustrative, and the method is not limited to the above specifically described order unless otherwise specifically stated.

Figure 3:
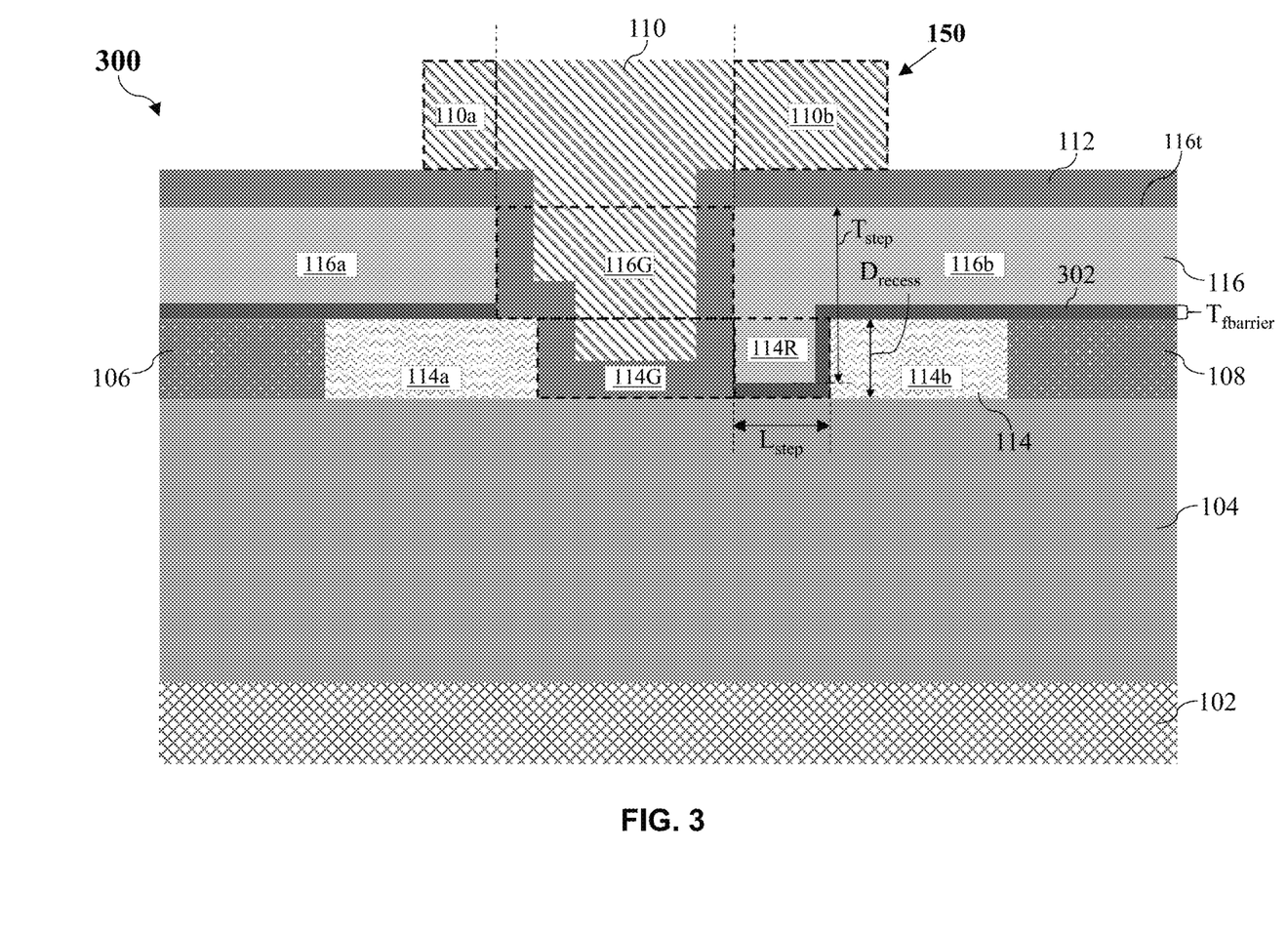
FIG. 3 shows a simplified cross-sectional view of a transistor device according to alternative non-limiting embodiments.

FIG. 3 shows a transistor device 300 according to alternative non-limiting embodiments. The transistor device 300 may be similar to the transistor device 100, and thus, the common features are labelled with the same reference numerals and need not be discussed.

Referring to FIG. 3, similar to the transistor device 100, the transistor device 300 may also include a barrier layer 114 having a recess 114R laterally between the gate terminal 110 and the drain terminal 108. However, in the transistor device 300, the recess 114R may extend fully through a thickness of the barrier layer 114. By "extend fully", it is meant that the thickness $T_{barrier}$ of the barrier layer 114 under the recess 114R may range from about 0 nm to about 2 nm (due to possible errors in the fabrication process). In the non-limiting embodiment shown in FIG. 3, the recess 114R may extend until the buffer layer 104 and the thickness $T_{barrier}$ of the barrier layer 114 under the recess 114R may be approximately 0 nm (thus, this thickness $T_{barrier}$ is not labelled in FIG. 3). Further, the transistor device 300 may additionally include a further barrier layer 302 arranged to line a bottom surface of the recess 114R. As shown in FIG. 3, the further barrier layer 302 may also line a side surface of the recess 114R and the top surfaces of the source terminal 106, the barrier layer 114 and the drain terminal 108. The further barrier layer 302 may be a thin layer. For example, a thickness $T_{fbarrier}$ of the further barrier layer 302 may range from about 0.5 nm to about 4 nm. The further barrier layer 302 may include barrier material such as, but not limited to, aluminum nitride (AlN), aluminum oxide nitride (AlON), or any other material having a positive fixed charge. Also, unlike the transistor device 100, the second passivation segment 116b of the passivation layer 116 may not include any recess. Instead, the second passivation segment 116b may include a planar surface 116t (facing away from the barrier layer 114), where the planar surface 116t may partially overlap vertically with the recess 114R of the barrier layer 114. A thickness $T_{step}$ of the passivation layer 116 between the gate dielectric layer 112 over the recess 114R and a bottom surface of the recess 114R may range from about 10 nm to about 500 nm. A depth $D_{recess}$ of the recess 114R may range from about 5 nm to about 30 nm. A length $L_{recess}$ of the recess 114R may be similar to that in the device 100.

FIGS. 4A to 4D show simplified cross-sectional views illustrating a method for fabricating the transistor device 300 according to various non-limiting embodiments. For clarity of illustration, some reference numerals have been omitted from FIGS. 4A to 4D.

Figure 4A:
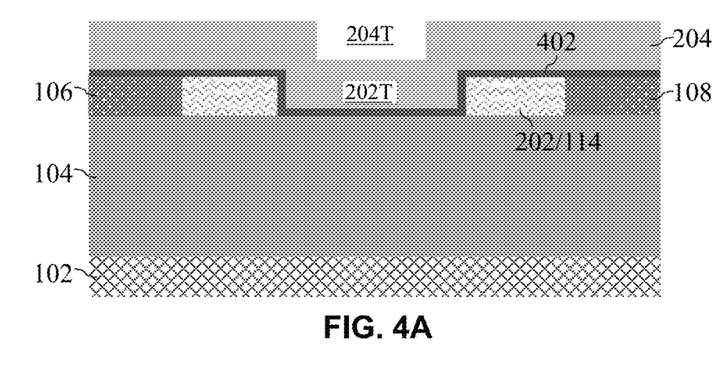
FIGS. 4A to 4D show simplified cross-sectional views illustrating a method of forming the transistor device of FIG. 3 according to various non-limiting embodiments.

Referring to FIG. 4A, the method may include providing the substrate 102 and forming the buffer layer 104 over the substrate 102. The method may further include forming the source terminal 106 and the drain terminal 108 over the buffer layer 104.

Figure 4B:
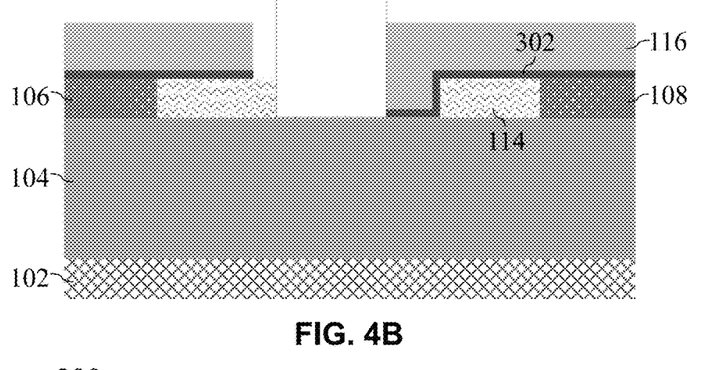

Referring to FIGS. 4A to 4B, the method may further include forming the barrier layer 114 over the buffer layer 104 and the passivation layer 116 over the barrier layer 114 in a manner similar to that described above with reference to FIGS. 2A to 2D. In particular, as shown in FIG. 4A, a layer of barrier material 202 may be formed over the buffer layer 104 and a first trench 202T may be formed within the layer of barrier material 202. However, unlike in FIG. 2A, the first trench 202T may extend fully through a thickness of the barrier material 202 and thus, the barrier layer 114 including the first and second barrier portions 114a, 114b may be formed. The method may further include forming a layer of barrier material 402 over the barrier layer 114, the source terminal 106 and the drain terminal 108, and forming a layer of passivation material 204 over the layer of barrier material 402. The layer of barrier material 402 may be formed using an atomic layer deposition (ALD) method or any other method as known to those skilled in the art. Due to the presence of the first trench 202T, the layer of passivation material 204 may include a second trench 204T narrower than the first trench 202T. As shown in FIG. 4B, the method may include forming the further barrier layer 302 and the passivation layer 116 from the layer of barrier material 402 and the layer of passivation material 204, respectively. In particular, the method may include removing a part of the layer of passivation material 204 and a part of the layer of barrier material 402 to form the passivation layer 116 and the further barrier layer 302, respectively.

Figure 4C:
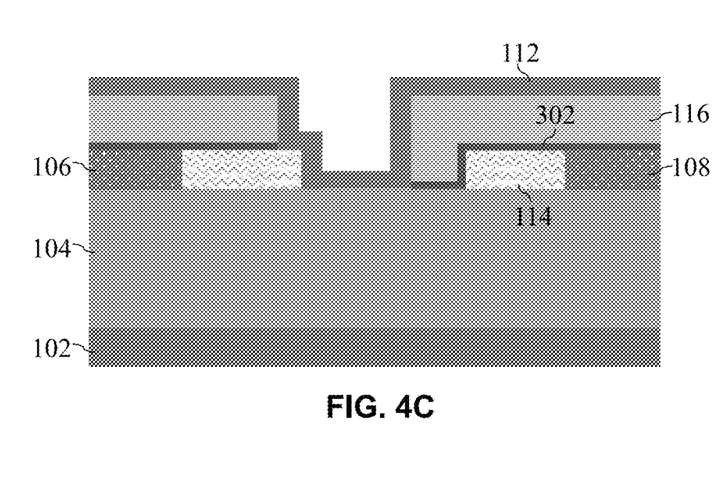
Figure 4D:
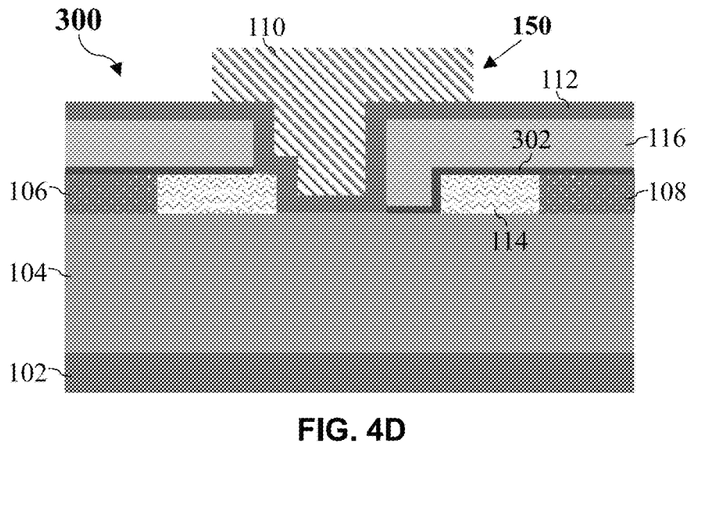

Referring to FIGS. 4C and 4D, the method may include forming the gate dielectric layer 112 over the passivation layer 116 and forming the gate terminal 110 over the buffer layer 104 in a manner similar to that described with reference to FIGS. 2C and 2D.

The above described order for the method is only intended to be illustrative, and the method is not limited to the above specifically described order unless otherwise specifically stated.

Figure 5:
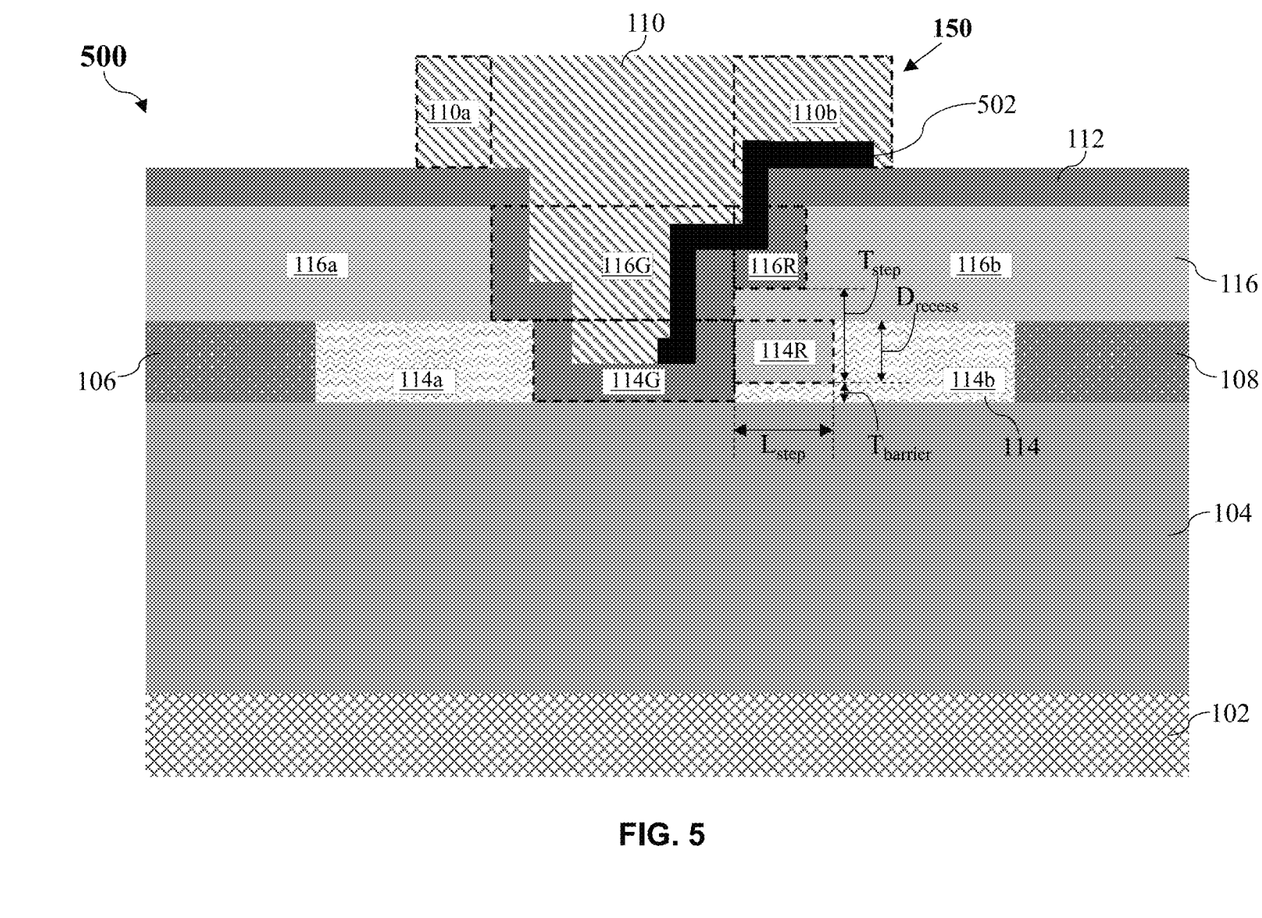
FIG. 5 shows a simplified cross-sectional view of a transistor device according to alternative non-limiting embodiments.
Figure 6:
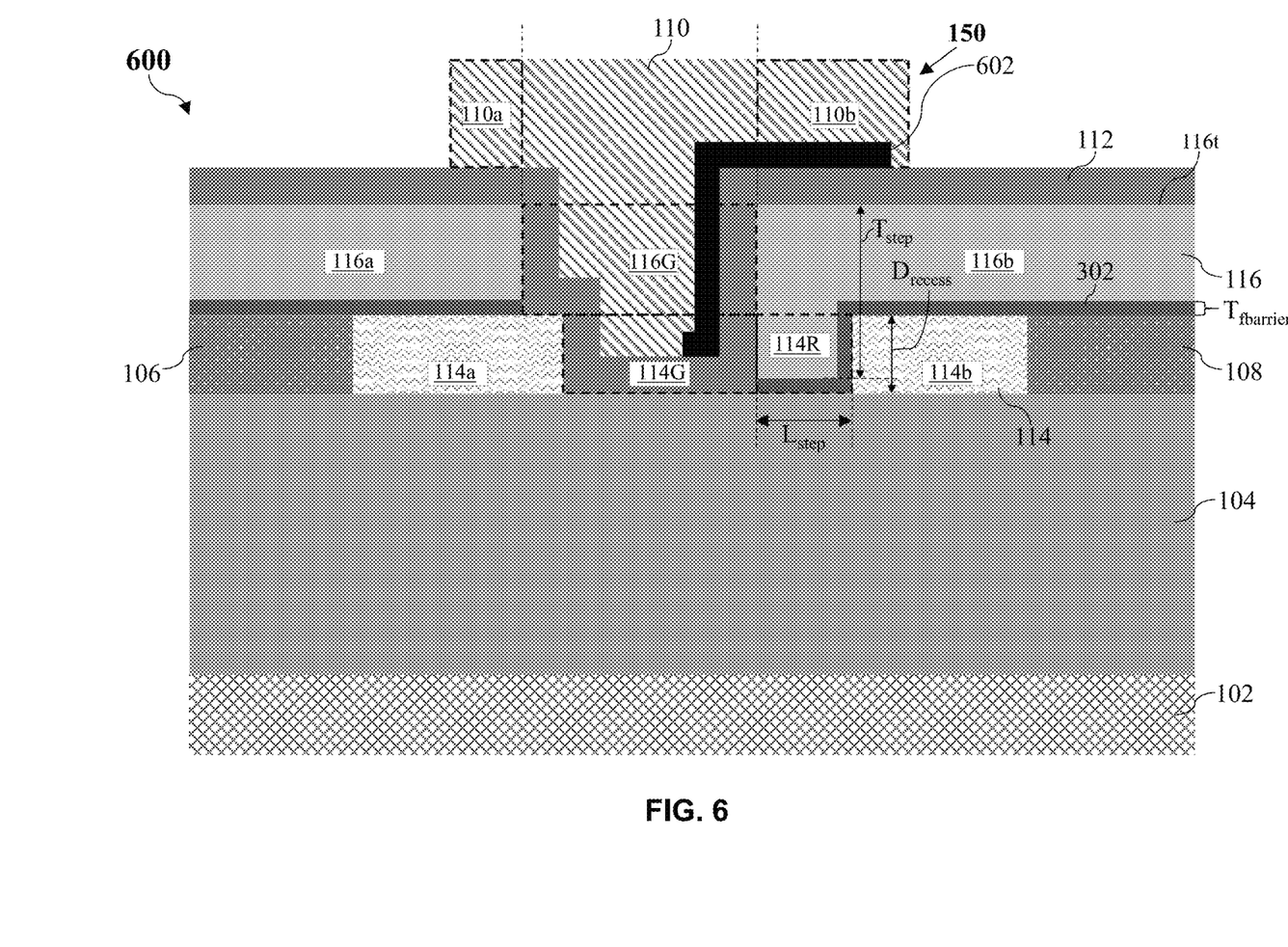
FIG. 6 shows a simplified cross-sectional view of a transistor device according to alternative non-limiting embodiments.

FIGS. 5 and 6 respectively show a transistor device 500 and a transistor device 600 according to alternative non-limiting embodiments. The transistor device 500 may be similar to the transistor device 100, and the transistor device 600 may be similar to the transistor device 300, and thus, the common features are labelled with the same reference numerals and need not be discussed.

As shown in FIG. 5, as compared to the transistor device 100, the transistor device 500 may further include a metal layer 502 arranged over the passivation layer 116. Similarly, as shown in FIG. 6, as compared to the transistor device 300, the transistor device 600 may further include a metal layer 602 arranged over the passivation layer 116. In particular, in each transistor device 500, 600, the metal layer 502, 602 may be arranged to line the gate dielectric layer 112 (in other words, the metal layer 502, 602 may be arranged between the gate dielectric layer 112 and the gate terminal 110). Each metal layer 502, 602, together with the respective gate terminal 110, may form a double gate metal layer. For each metal layer 502, 602, at least a part of the metal layer 502, 602 may overlap vertically with the recess 114R of the barrier layer 114. The part of the metal layer 502, 602 overlapping vertically with the recess 114R may extend over the passivation layer 116 and laterally beyond the recess 114R in a direction towards the drain region 108. The metal layer 502 of the device 500 may further extend into the recess 116R of the passivation layer 116, the gap 116G of the passivation layer 116 and the gap 114G of the barrier layer 114. Similarly, the metal layer 602 of the device 600 may further extend into the gap 116G of the passivation layer 116 and the gap 114G of the barrier layer 114. Each metal layer 502, 602 may have a low work function. For example, each metal layer 502, 602 may have a work function ranging from about 4.2V to about 5.5V. The transistor devices 500, 600 may be fabricated in a similar manner as the fabrication of the transistor devices 100, 300 as described above, except with an additional process to form the metal layer 502, 602.

For example, the metal layer 502, 602 may be formed by depositing a metal material over the gate dielectric layer 112 and etching the metal material. The gate terminal 110 may then be formed by depositing an electrically conductive material over the gate dielectric layer 112 and the metal layer 502, 602 and etching the electrically conductive material.

Figure 7:
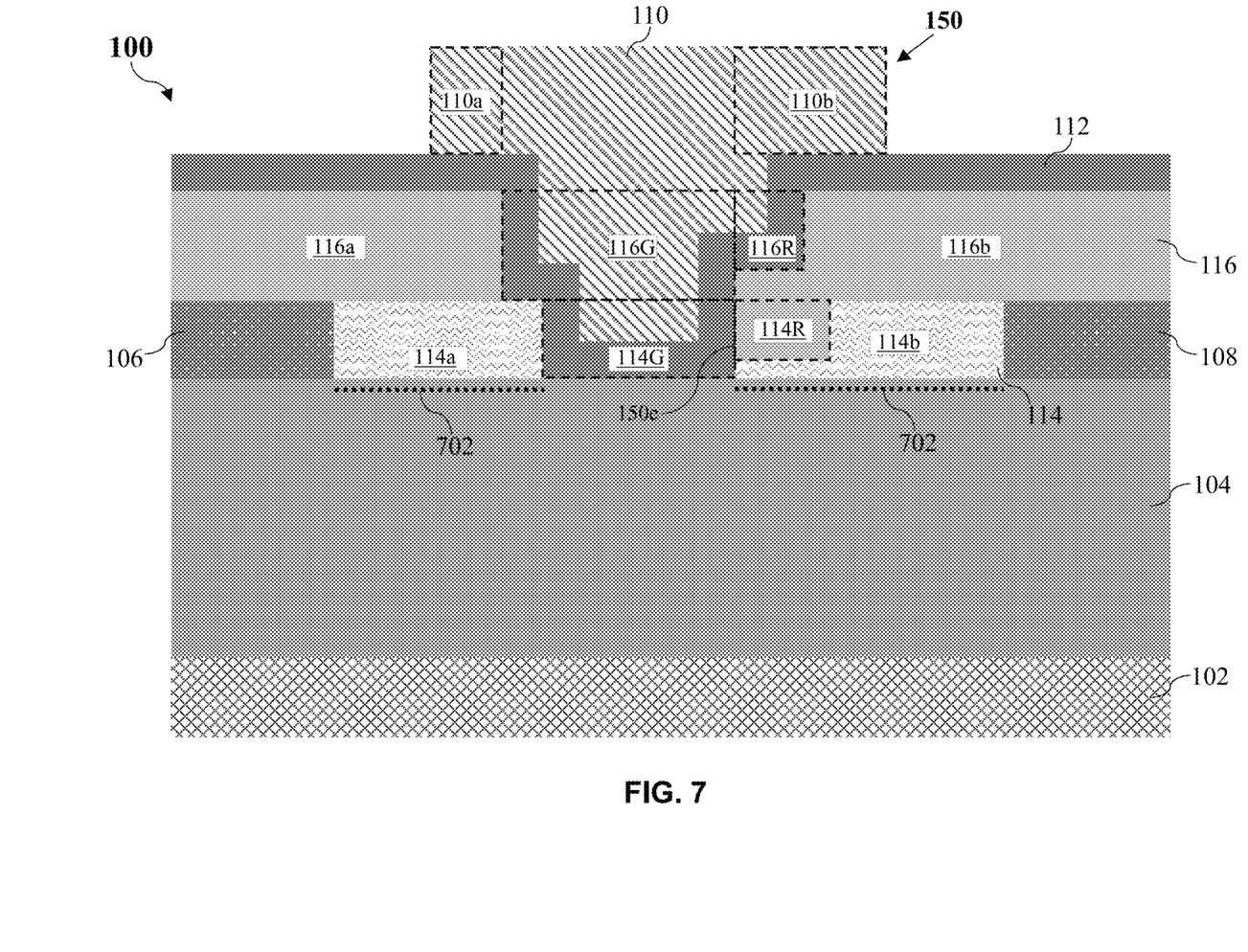
FIG. 7 shows a simplified cross-sectional view of the transistor device of FIG. 1 in operation.

FIG. 7 shows the transistor device 100 in operation. The transistor device 100 may be a normally-off transistor device operating in the enhancement mode. In particular, as shown in FIG. 7, a 2DEG channel 702 may be formed near the interface between the barrier layer 114 and the buffer layer 104, due to the spontaneous and piezoelectric polarization effect of the barrier and buffer material of the layers 114, 104. However, the portion of the 2DEG channel 702 under the gate structure 150 may be depleted due to an absence of barrier material within the gap 114G. In use, a positive gate voltage may be applied to the gate structure 150 such that the gate-drain bias may be greater than the threshold voltage $V_{th}$ of the device 100. With this positive gate voltage, the portion of the 2DEG channel 702 under the gate structure 150 may be formed and current may flow through the 2DEG channel 702, thus turning the transistor device 100 on. To turn off the transistor device 100, a gate voltage below the threshold voltage may be applied. This gate voltage may, for example, be 0V or a negative voltage.

By including the recess 114R in the barrier layer 114 of the transistor device 100, the thickness of the dielectric material (including the gate dielectric material and the passivation material) between the gate terminal 110 and the barrier layer 114 may be greater. This can help to reduce the electric field at the drain side gate edge 150e of the gate structure 150 when the transistor device 100 is in the semi-on state. This can in turn help to suppress the hot carrier generation and gate degradation of the transistor device 100. Thus, the stability of the device 100, the threshold voltage $V_{th}$ of the device 100 and reliability of the gate edge 150e can be enhanced. Further, the dynamic on-resistance $R_{on}$ performance can also be enhanced as fewer hot carriers may be trapped in the barrier and buffer material of the barrier and buffer layers 114, 104. Further, the off-state breakdown voltage (BV) can be increased since the gate degradation of the device 100 (due to a high electric field at the drain side gate edge 150e) may be suppressed. Thus, the overall reliability of the transistor device 100 may improve. The length $L_{step}$ of the recess 114R may be varied to adjust the electric field at the drain side gate edge 150e of the gate structure 150 and the threshold voltage $V_{th}$ of the transistor device 100. The thickness $T_{barrier}$ of the barrier layer 114 under the recess 114R in the transistor device 100 may be varied to adjust the carrier/electron density under the recess 114R (and thus, the threshold voltage $V_{th}$ to form the portion of the 2DEG channel under the recess 114R).

The transistor devices 300, 500, 600 may operate in a similar manner as the operation of the transistor device 100 described above, except that for the transistor devices 300 and 600, the portion of the 2DEG channel 702 under the recess 114R may be formed due to the presence of a positive fixed charge in the further barrier layer 302 (since there is an absence of barrier material under the recess 114R in the barrier layer 114). This positive fixed charge may introduce electron carriers near the interface of the further barrier layer 302 and the buffer layer 104. The thickness $T_{fbarrier}$ of the further barrier layer 302 lining the bottom surface of the recess 114R in the transistor device 300/600 may be varied to adjust the carrier/electron density under the recess 114R (and thus, the threshold voltage $V_{th}$ to form the portion of the 2DEG channel under the recess 114R). As described above, each of the transistor devices 500, 600 may include a metal layer 502, 602 with a low work function over the passivation layer 116. By varying the work function of the metal layer 502/602, the carrier density under the second barrier portion 114b (and thus, the threshold voltage $V_{th}$ to form the portion of the 2DEG channel 702 under the second barrier portion 114b) in the transistor device 500/600 may be varied.

FIGS. 8A to 8F show technology computer-aided design (TCAD) images illustrating simulated electric field distributions within a prior art transistor device and the transistor device 100 in the semi-on state, with a drain bias of 100V and with varying thicknesses $T_{step}$ of the passivation layer 116 and varying lengths $L_{step}$ of the recess 114R. The prior art transistor device may be similar to the transistor device 100, but with the recess 114R absent (in other words, with the second barrier portion 114b having a substantially uniform thickness). In FIGS. 8A to 8F, the intensity of each pixel indicates a strength of the electric field at the point in the prior art device or the transistor device 100 corresponding to the pixel in the image. In particular, the higher the intensity of the pixel, the larger the electric field strength. For clarity of illustration, some reference numerals are omitted from FIGS. 8A to 8F.

Figure 8A:
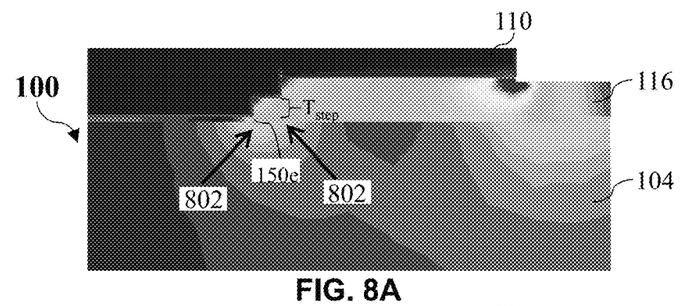
FIGS. 8A to 8F show technology computer-aided design (TCAD) images illustrating simulated electric field distributions within a prior art transistor device and the transistor device of FIG. 1.
Figure 8B:
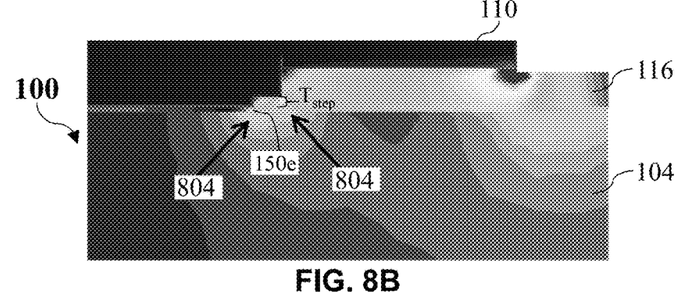
Figure 8C:
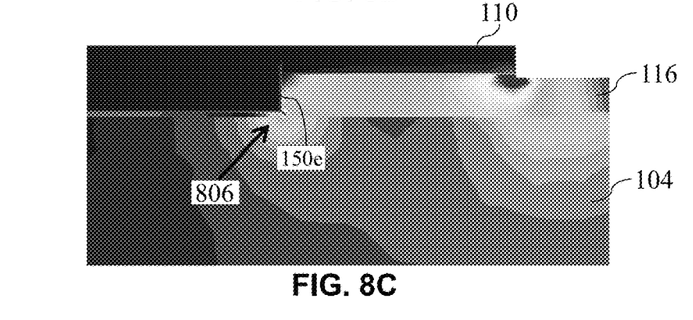

In particular, FIGS. 8A to 8B respectively show the electric field distributions 802, 804 around the drain side gate edge 150e in the transistor device 100 when the thickness $T_{step}$ is 80 nm and 40 nm respectively. FIG. 8C shows the electric field distribution 806 around the drain side gate edge 150e in the prior art device. As shown in FIGS. 8A to 8C, as compared to the prior art transistor device, the electric field at the drain side gate edge 150e may be reduced by including the recess 114R with the passivation layer 116 extending into the recess 114R. As shown in FIGS. 8A to 8C, the uniformity of the electric field at the drain side gate edge 150e may be the highest when the thickness $T_{step}$ is 40 nm.

Figure 8D:
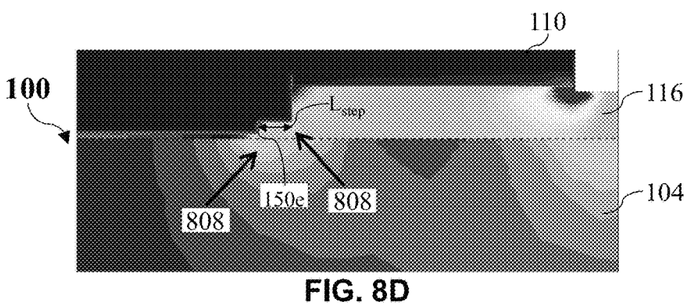
Figure 8E:
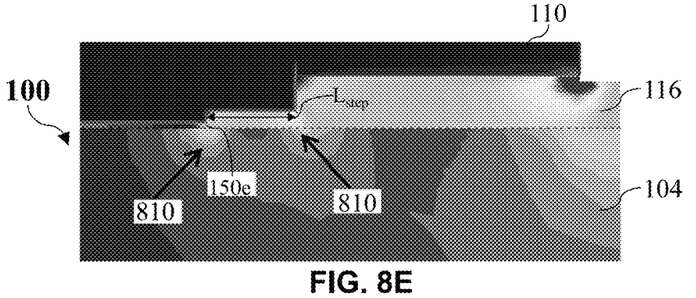
Figure 8F:
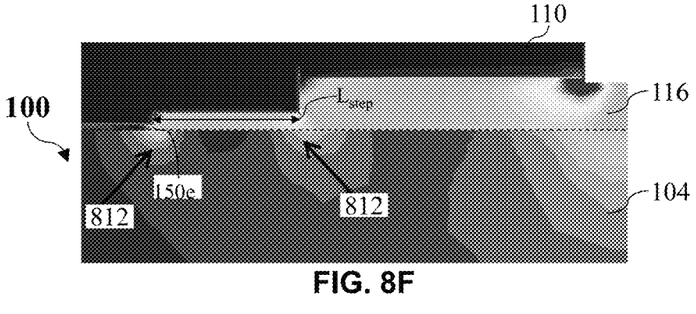

FIGS. 8D to 8F respectively show the electric field distributions 808, 810, 812 around the drain side gate edge 150e in the transistor device 100 when the length $L_{step}$ of the recess 114R is 100 nm, 300 nm and 500 nm, respectively. As shown in FIGS. 8D to 8F, a sufficiently uniform electric field around the drain side gate edge 150e may be achieved with a length $L_{step}$ of between 100 nm and 300 nm.

FIGS. 9A to 9F show TCAD images illustrating simulated concentrations of hot carriers (or impact ionization carriers) within a prior art transistor device (similar to that described above with reference to FIG. 8C) and the transistor device 100 in the semi-on state with a drain bias of about 100V, a source current of about 10 mA/mm, and with varying thicknesses $T_{step}$ of the passivation layer 116 and varying lengths $L_{step}$ of the recess 114R. In FIGS. 9A to 9F, the intensity of each pixel indicates a concentration of hot carriers at the point in the prior art device or the transistor device 100 corresponding to the pixel in the image. In particular, the higher the intensity of the pixel, the larger the concentration of hot carriers. For clarity of illustration, some reference numerals are omitted from FIGS. 9A to 9F.

Figure 9A:
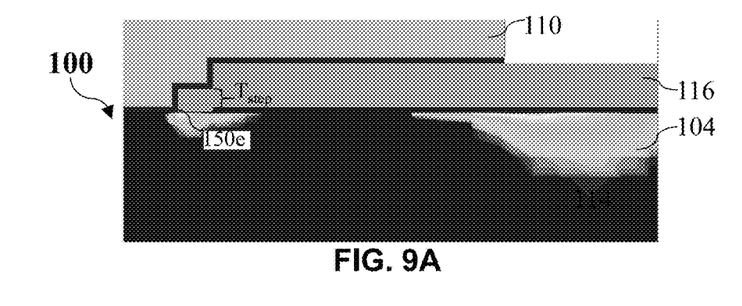
FIGS. 9A to 9F show TCAD images illustrating simulated concentrations of hot carriers within a prior art transistor device and within the transistor device of FIG. 1.
Figure 9B:
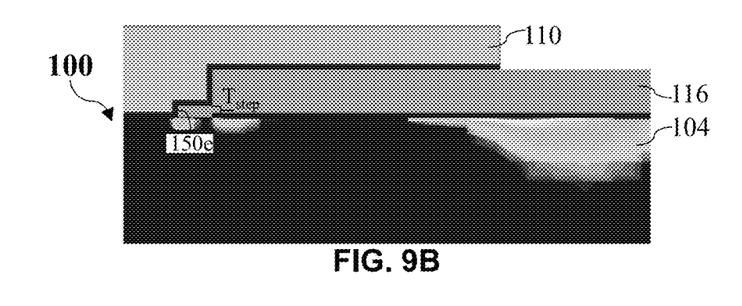
Figure 9C:
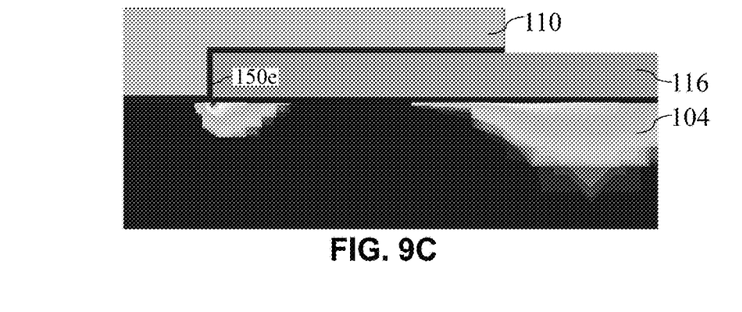

In particular, FIGS. 9A to 9B respectively show the hot carrier concentrations around the drain side gate edge 150e in the transistor device 100 when the thickness $T_{step}$ is 80 nm and 40 nm respectively. FIG. 9C shows the hot carrier concentrations around the drain side gate edge 150e in the prior art device. As shown in FIGS. 9A to 9C, as compared to the prior art transistor device, the hot carrier concentration at the drain side gate edge 150e may be reduced by including the recess 114R with the passivation layer 116 extending into the recess 114R.

Figure 9D:
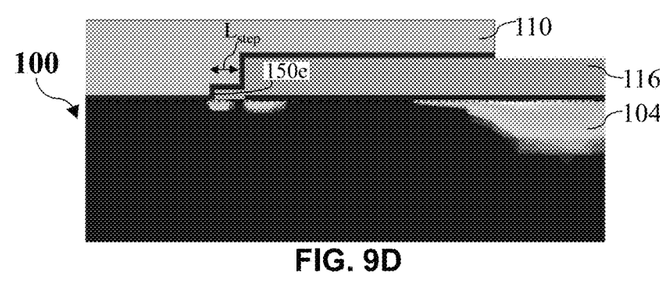
Figure 9E:
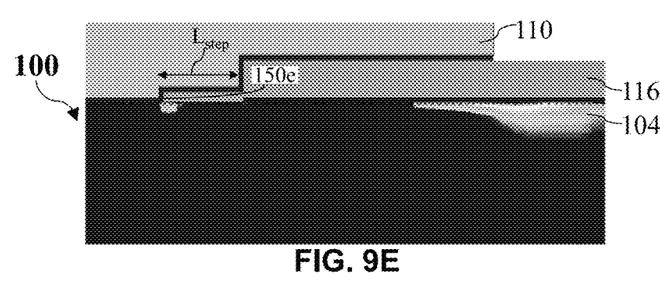
Figure 9F:
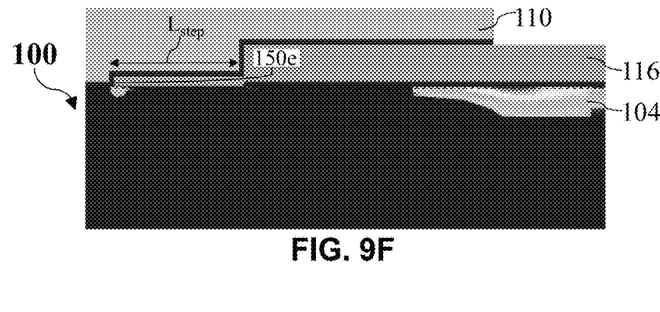

FIGS. 9D to 9F respectively show the hot carrier concentrations around the drain side gate edge 150e in the transistor device 100 when the length $L_{step}$ of the recess 114R is 100 nm, 300 nm and 500 nm, respectively. As shown in FIGS. 9D to 9F, the hot carrier concentration around the drain side gate edge 150e may decrease as the length $L_{step}$ of the recess 114R increases.

Figure 10A:
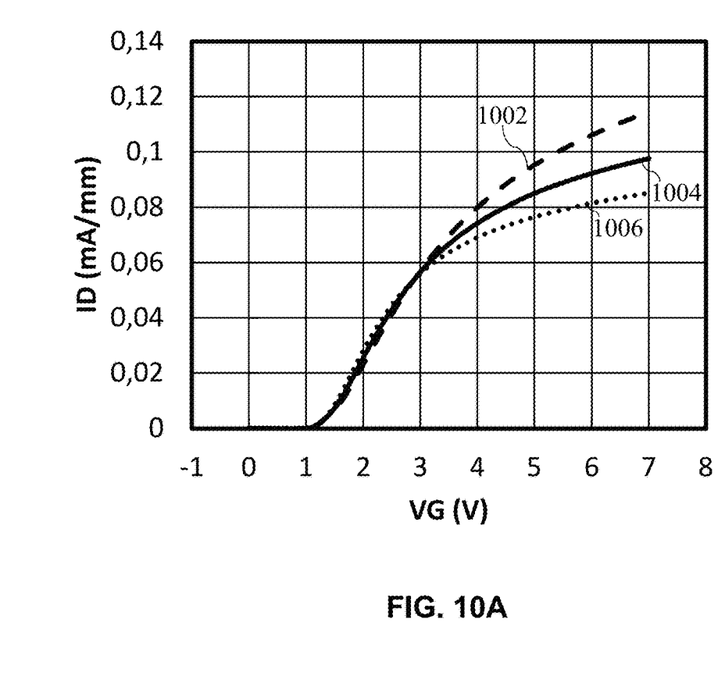
FIGS. 10A and 10B respectively show drain current-gate voltage graphs and drain current-drain voltage graphs for the transistor device of FIG. 1.
Figure 10B:
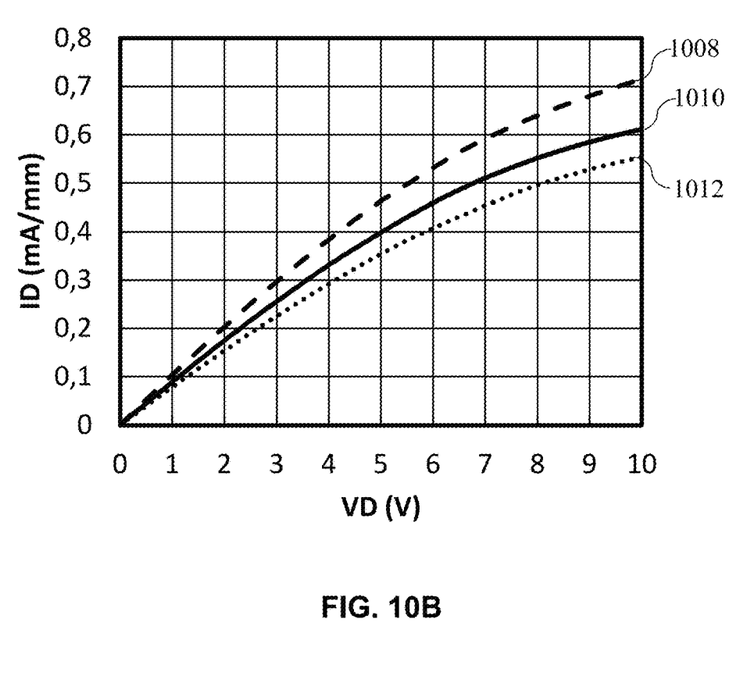

FIGS. 10A and 10B respectively show drain current-gate voltage (ID-VG) graphs 1002, 1004, 1006 (with the drain voltage VD=1V) and drain current-drain voltage (ID-VD) graphs 1008, 1010, 1012 (with the gate voltage VG=7V) for the transistor device 100 when the thickness $T_{step}$ of the passivation layer 116 is 40 nm. In particular, in FIG. 10A, the graphs 1002, 1004, 1006 show the ID-VG relationship when the length $L_{step}$ is 100 nm, 300 nm and 500 nm, respectively; whereas, in FIG. 10B, the graphs 1008, 1010, 1012 show the ID-VD relationship when the length $L_{step}$ is 100 nm, 300 nm and 500 nm, respectively. As shown in FIGS. 10A and 10B, the on-resistance $R_{on}$ may increase as $L_{step}$ increases. This may be because the portion of the channel 702 under the recess 114R may be less conductive than the portion of the channel 702 under the non-recessed parts of the barrier layer 114. Therefore, the larger the $L_{step}$ (in other words, the longer the portion of the channel 702 under the recess 114R), the higher the on-resistance $R_{on}$.

Figure 11A:
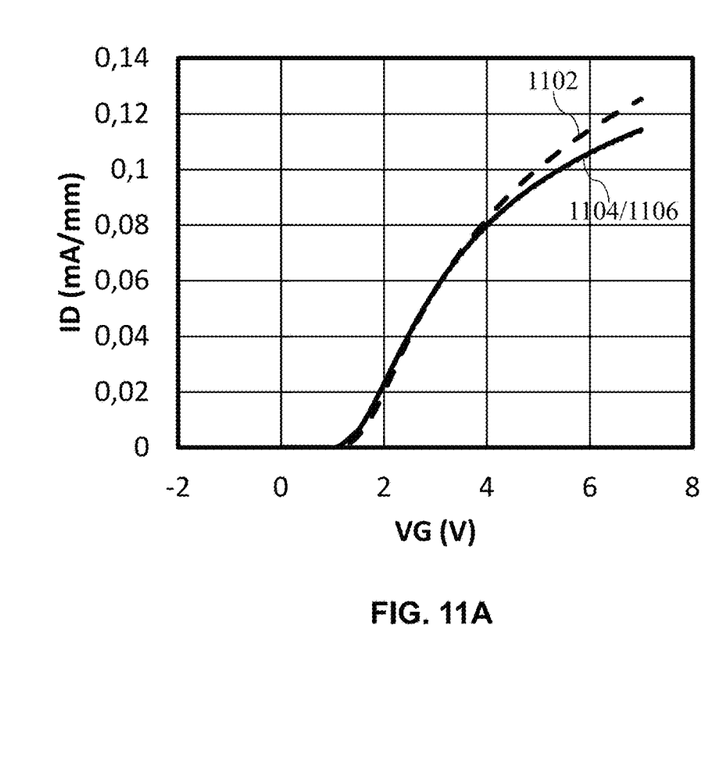
FIGS. 11A and 11B respectively show drain current-gate voltage graphs and drain current-drain voltage graphs for a prior art transistor device and the transistor device of FIG. 1.
Figure 11B:
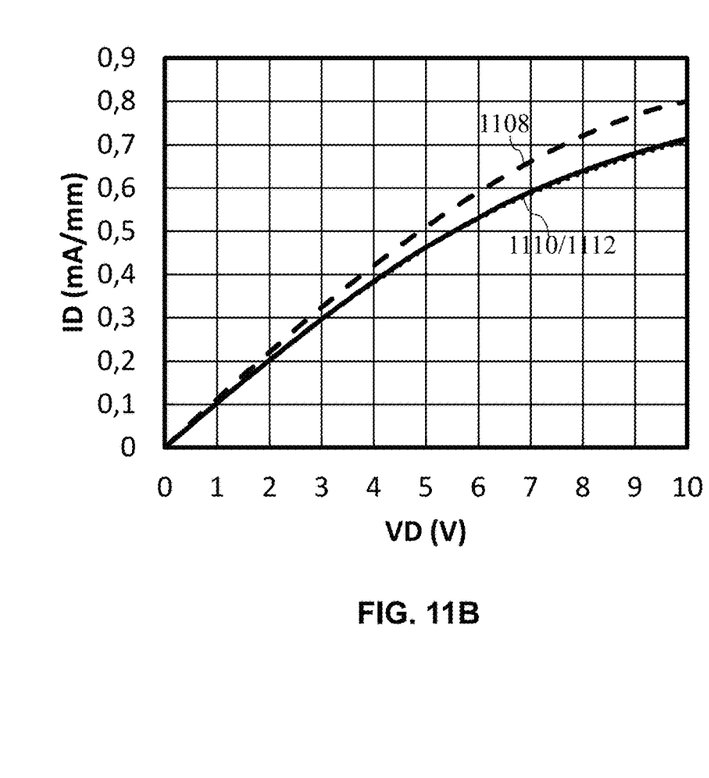

FIGS. 11A and 11B respectively show drain current-gate voltage (ID-VG) graphs 1102, 1104, 1106 (with the drain voltage (VD)=1V) and drain current-drain voltage (ID-VD) graphs 1108, 1110, 1112 (with the gate voltage VG=7V) for a prior art device (similar to that described above with reference to FIG. 8C) and the transistor device 100 when the length $L_{step}$ of the recess 114R is 100 nm. In particular, in FIG. 11A, the graph 1102 shows the ID-VG relationship for the prior art transistor device, and the graphs 1104, 1106 show the ID-VG relationship for the transistor device 100 when the thickness $T_{step}$ of the passivation layer 116 is 40 nm and 80 nm, respectively. Similarly, in FIG. 11B, the graph 1108 shows the ID-VG relationship for the prior art device, and the graphs 1110, 1112 show the ID-VG relationship for the transistor device 100 when the thickness $T_{step}$ is 40 nm and 80 nm, respectively. As shown in FIGS. 11A and 11B, the graphs 1104, 1106 substantially overlap each other, and the graphs 1110, 1112 substantially overlap each other. In other words, the on-resistance $R_{on}$ of the transistor device 100 may be about the same when the thickness $T_{step}$ is 40 nm and when it is 80 nm. However, the on-resistance $R_{on}$ may increase if the thickness $T_{step}$ increases further, because a larger $T_{step}$ may cause weaker gate control and fewer carriers in the channel 702 under the barrier layer 114.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A transistor device comprising:
   a substrate;
   a buffer layer arranged over the substrate;
   a source terminal, a drain terminal, and a gate terminal arranged over the buffer layer; wherein the gate terminal is arranged laterally between the source terminal and the drain terminal, wherein the source terminal and the drain terminal are arranged directly on the buffer layer;
   a barrier layer arranged over the buffer layer, wherein the harrier layer is disposed laterally between the source terminal and the drain terminal and wherein the barrier layer comprises a recess laterally between the gate terminal and the drain terminal;
   a passivation layer arranged over the barrier layer, wherein a part of the gate terminal is arranged over the passivation layer, and wherein the passivation layer extends into the recess of the barrier layer overlapping vertically and horizontally with the barrier laver, and
   a gate dielectric layer arranged over the passivation layer, the gate dielectric layer overlapping vertically and horizontally with the passivation layer, wherein the gate dielectric layer and the passivation layer are made of different materials.

2. The transistor device of claim 1, wherein the part of the gate terminal is arranged over the recess of the barrier layer.

3. The transistor device of claim 1, wherein the recess extends partially through a thickness of the barrier layer.

4. The transistor device of claim 1, wherein the recess extends fully through a thickness of the barrier layer.

5. The transistor device of claim 4, further comprising a further barrier layer arranged to line a bottom surface of the recess.

6. The transistor device of claim 1, further comprising a metal layer arranged over the passivation layer; wherein at least a part of the metal layer overlaps vertically with the recess of the barrier layer.

7. The transistor device of claim 1, wherein the barrier layer comprises:
   a first barrier portion;
   a second barrier portion; and
   a gap arranged laterally between the first barrier portion and the second barrier portion separating the first barrier portion and the second barren portion;
   wherein the gate terminal extends partially into the gap of the barrier layer, such that the first barrier portion is arranged laterally between the source terminal and the gate terminal, and the second barrier portion is arranged laterally between the drain terminal and the gate terminal.

8. The transistor device of claim 7, wherein a thickness of the first barrier portion is substantially uniform; and wherein the recess is arranged within the second barrier portion.

9. The transistor device of claim 7, further comprising a gate dielectric layer arranged at least partially under the gate terminal, wherein the gate dielectric layer lines the gap of the barrier layer.

10. The transistor device of claim 9, wherein the recess of the barrier layer extends laterally from the gate dielectric layer in a direction towards the drain terminal.

11. The transistor device of claim 9, further comprising a metal layer arranged between the gate dielectric layer and the gate terminal.

12. The transistor device of claim 11, wherein at least a part of the metal layer overlaps vertically with the recess of the barrier layer.

13. The transistor device of claim 12, wherein the metal layer further extends into the gap of the barrier layer.

14. The transistor device of claim 7, wherein the passivation layer comprises a first passivation segment arranged over the first barrier portion, a second passivation segment arranged over the second barrier portion and a further gap arranged laterally between the first passivation segment and the second passivation segment and separating the first passivation segment and the second passivation segment.

15. The transistor device of claim 14, wherein the first barrier portion protrudes laterally beyond the first passivation segment in a direction towards the gate terminal.

16. The transistor device of claim 14, wherein the second passivation segment comprises a recess overlapping vertically with the recess of the barrier layer.

17. The transistor device of claim 14, wherein the second passivation segment comprises a planar surface facing away from the barrier layer and partially overlapping vertically with the recess of the barrier layer.

18. The transistor device of claim 1, wherein the transistor device is a high electron mobility transistor device.

19. A method of forming a transistor device, the method comprising:
  providing a substrate;
  forming a buffer layer over the substrate;
  forming a source terminal, a drain terminal, and a barrier layer directly on the buffer layer, wherein the barrier layer comprises a recess; wherein the barrier layer is disposed laterally between the source terminal and the drain terminal;
  forming a passivation layer over the barrier layer, wherein the passivation layer extends into the recess of the barrier layer overlapping vertically and horizontally with the barrier layer;
  forming a gate terminal over the buffer layer, wherein the gate terminal is arranged laterally between the source terminal and the drain terminal, wherein a part of the gate terminal is arranged over the passivation layer, and wherein the recess of the barrier layer is arranged laterally between the gate terminal and the drain terminal, and
  forming a gate dielectric layer arranged over the passivation layer, the gate dielectric layer overlapping vertically and horizontally with the passivation layer, wherein the gate dielectric layer and the passivation layer are made of different materials.

20. The method of claim 19, wherein forming the barrier layer over the buffer layer and the passivation layer over the barrier layer comprises:
  forming a layer of barrier material over the buffer layer;
  forming a first trench within the layer of barrier material;
  forming a layer of passivation material over the layer of barrier material, wherein the layer of passivation material comprises a second trench narrower than the first trench; and
  forming the barrier layer and the passivation layer from the layer of barrier material and the layer of passivation material, respectively.

* * * * *